United States Patent [19]

Inoue et al.

[11] Patent Number: 4,694,262
[45] Date of Patent: Sep. 15, 1987

[54] OSCILLATOR WITH RESONATOR HAVING A SWITCHED CAPACITOR FOR FREQUENCY CHANGING

[76] Inventors: Atsushi Inoue, 51-15, Oneo, Hirono-cho, Uji-shi, Kyoto; Yuji Kuroda, 653-6, Namazu-cho, Fushimi-ku, Kyoto-shi, Kyoto; Sadahiro Tamura, 3-1-72, Kitafukunishi-cho, Ohe, Nishikyo-ku, Kyoto-shi, Kyoto, all of Japan

[21] Appl. No.: 632,104

[22] Filed: Jul. 18, 1984

[30] Foreign Application Priority Data

Jul. 23, 1983 [JP]  Japan ................................ 58-134885

[51] Int. Cl.$^4$ .............................................. H03B 5/18
[52] U.S. Cl. ................................ 331/96; 331/107 DP; 331/117 D; 331/179
[58] Field of Search ............... 331/96, 107 DP, 117 D, 331/179; 333/221, 223, 231, 235

[56] References Cited

U.S. PATENT DOCUMENTS

| 3,668,553 | 6/1972 | Dunn et al. ......................... 331/96 X |
| 3,891,940 | 6/1975 | Sekiguchi ........................ 331/179 X |
| 3,988,701 | 10/1976 | Funston ................................ 331/179 |
| 4,255,729 | 3/1981 | Fukasawa et al. ............... 333/231 X |
| 4,318,064 | 3/1982 | Kach .................................. 333/206 X |
| 4,370,626 | 1/1983 | Ushida .................................... 331/96 |
| 4,389,624 | 6/1983 | Aihara et al. .................... 333/207 X |
| 4,503,401 | 3/1985 | Kyriakos et al. ................ 331/179 X |
| 4,506,241 | 3/1985 | Makimoto et al. ............. 333/206 X |

*Primary Examiner*—Eugene R. LaRoche
*Assistant Examiner*—D. C. Mis

[57] ABSTRACT

An oscillation circuit comprises a resonator and frequency switching means for switching oscillating frequencies of the resonator, said frequency switching means including a capacitor and an electrical switching element in series, said electrical switching element having a small capacitance as compared to that of said capacitor and a conductive voltage larger than a peak voltage of the oscillation circuit output applied across the electrical switching element. Preferably, the electrical switching element is a diode.

5 Claims, 6 Drawing Figures

OSCILLATOR WITH RESONATOR HAVING A SWITCHED CAPACITOR FOR FREQUENCY CHANGING

BACKGROUND OF THE INVENTION

This invention relates to an oscillation circuit and, more particularly, to an oscillation circuit suitable for a voltage-controlled oscillator.

In an oscillation circuit such as a voltage-controlled oscillator for an automobile radio, it is desired that a high Q value of the oscillation output thereof be provided, such as in a dielectric resonator of a coaxial TEM wave type for high oscillation frequency switching.

SUMMARY OF THE INVENTION

Accordingly, it is an object of the present invention to provide an improved oscillation circuit comprising a dielectric resonator.

It is another object of the present invention to provide an improved oscillation circuit comprising a dielectric resonator of a coaxial TEM wave type.

It is still another object of the present invention to provide an improved oscillation circuit comprising a frequency switching circuit for a dielectric resonator of a coaxial TEM wave type.

Other objects and further scope of applicability of the present invention will become apparent from the detailed description given hereinafter. It should be understood, however, that the detailed description and specific examples, while indicating preferred embodiments of the invention, are given by way of illustration only, since various changes and modifications within the spirit and scope of the invention will become apparent to those skilled in the art from this detailed description.

To achieve the above objects, pursuant to an embodiment of the present invention, an oscillation circuit comprises therein a resonator, and frequency switching means for switching the oscillating frequencies of the oscillation circuit, the frequency switching means being connected in parallel with the resonator and including a capacitor and an electrical switching element in series, the electrical switching element having a small capacitance between its plate and cathode as compared to that of the capacitor and a conductive voltage larger than a peak voltage of the oscillation circuit output applied across the electrical switching element. Preferably, the resonator is a dielectric resonator of a coaxial TEM wave type. The electrical switching element is a diode whose conductive voltage is larger than the peak voltage of the oscillation circuit output applied across itself in both a forward and a reverse direction.

BRIEF DESCRIPTION OF THE DRAWINGS

The present invention will become more fully understood from the detailed description given hereinbelow and the accompanying drawings which are given by way of illustration only, and thus are not limitative of the present invention and wherein.

DESCRIPTION OF THE PREFERRED EMBODIMENTS

Figure 1:
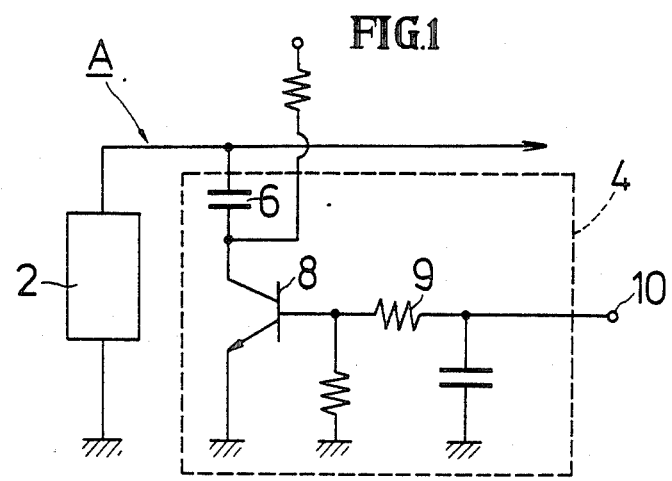
FIG. 1 shows a circuit diagram of an oscillation circuit according to a related technique.

FIG. 1 shows a circuit diagram of an oscillation circuit of related technique to be compared with present invention. Since the circuit of FIG. 1 is considered by the present inventors, this circuit is not necessarily conventional. In FIG. 1, an oscillation circuit A is provided with a dielectric resonator 2 of a coaxial TEM wave type. To enable the circuit A to resonate with one-fourth wavelength of the frequencies given, the dielectric resonator 2 has a cylindrical or an angular tubed dielectric having an electrode membrane each formed on the internal, external, and one end surfaces thereof for making a physical and electrical contact with all of the surfaces.

A frequency switching circuit 4 is connected in parallel with the dielectric resonator 2. The frequency switching circuit 4 includes a series circuit consisting of a capacitor 6 and a switching transistor 8. The switching transistor 8 acts as a frequency switching means for switching the oscillating frequencies of the oscillation circuit A. For this purpose, the switching transistor 8 is conductive or nonconductive in response to the corresponding levels of the biasing voltages applied to the base electrode of the transistor 8 from a switching voltage supplying terminal 10.

In operation, when the switching transistor 8 is kept in a conductive state by the positive switching voltage given at the base electrode via the resistor 9 from the switching voltage supplying terminal 10, the capacitor 6 is connected in parallel with the dielectric resonator 2 and acts as a part of a capacitive component of the oscillation circuit A. In the conductive state of the switching transistor 8, therefore, the oscillation circuit A can oscillate around a oscillating frequency $f_2$ as shown in a solid curved line of FIG. 5. On the other hand, when the positive switching voltage is not applied to the base electrode of the switching transistor 8, the switching transistor 8 is switched from the conductive state to the nonconductive state. In the nonconductive state of the switching transistor 8, the capacitor 6 is electrically disconnected from the dielectric resonator 2 and, therefore, the oscillation circuit A is switched to an oscillating condition around a oscillating frequency $f_1$ as shown in a dotted line of FIG. 5. Q as noted in FIG. 5 indicates a quality factor which relates to the amount of sharpness of the oscillation circuit output. Even when transistor 6 is non-conductive, the oscillation signals may leak through the collector-emitter capacitance and the collector-base capacitance of the transistor 6. Therefore, the Q value of the oscillation signal may be reduced, so that an output frequency range becomes wider and high frequency characteristics cannot be obtained.

Figure 2:
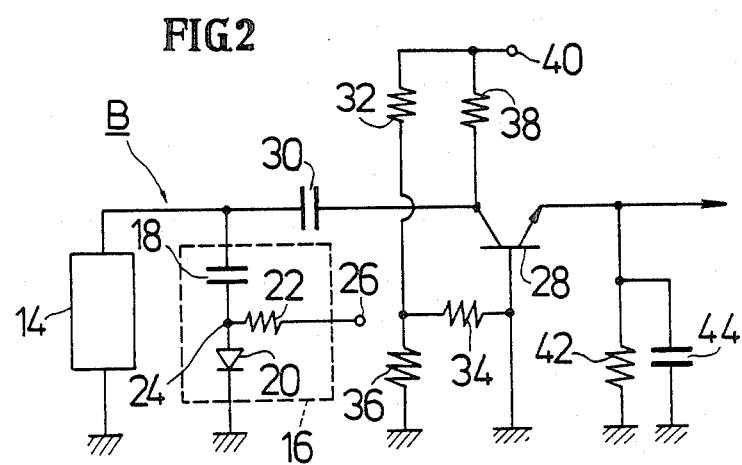
FIG. 2 shows a circuit diagram of an oscillation circuit according to a first preferred embodiment of the present invention.
Figure 3:
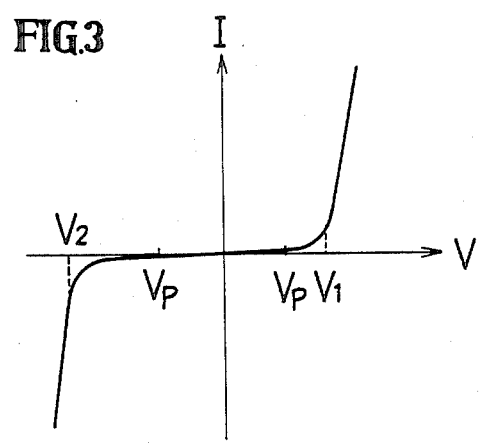
FIG. 3 shows a graph representative of a relationship between a voltage and a current of a diode included in the oscillation circuit in FIG. 2.

FIG. 2 shows a circuit diagram of an oscillation circuit of a first preferred embodiment of the present invention. Referring to FIG. 2, an oscillation circuit B is provided with a dielectric resonator 14 having a construction similar to that in FIG. 1 Similarly in FIG. 2, a frequency switching means 16 for switching the oscillation frequencies of the oscillation circuit B is connected in parallel with the dielectric resonator 14. The frequency switching means 16 includes a capacitor 18 and a switching diode 20 which act as a frequency switching element of the oscillation circuit B. A resistor 22 for preventing a high frequency leakage is connected to the connecting point 24 between the capacitor 18 and the switching diode 20. The frequency switching voltage for switching the oscillation frequencies of the oscillation circuit B is applied to frequency switching means 16 from the switching voltage supply terminal 26. The switching diode 20 has an electrostatic capacitance between the anode and cathode electrodes thereof adequately small as compared to that of the capacitor 18, and forward and reverse conductive voltages V1 and V2 that are larger than peak voltages Vp and Vp of the oscillation circuit B across the switching diode 20 as shown in FIG. 3, respectively. For example, the switching diode 20 is commercially marketed by Hitachi, Ltd., Japan as trade code 1ss110.

The oscillation circuit B further comprises an amplification transistor 28 connected to the dielectric resonator 14 via a capacitor 30, a plurality of base biasing resistors 32, 34 and 36 for the amplification transistor 28, a collector resistor 38 and an emitter resistor 42 of the amplification transistor 28, a power supply terminal 40 from which power is supplied to the oscillation circuit B, and a bypass capacitor 44.

In operation of the oscillation circuit B having such a construction as described above, when the level of the frequency switching voltage given at the anode of the switching diode 20 via the resistor 22 from the switching voltage supplying terminal 26 is less than the forward conductive voltage V1 of the switching diode 20, the switching diode 20 is kept in a nonconductive state. In the nonconductive state of the switching diode 20, the oscillation circuit B oscillates around the oscillation frequency $f_1$ as shown in the solid curved line of FIG. 6.

Figure 6:
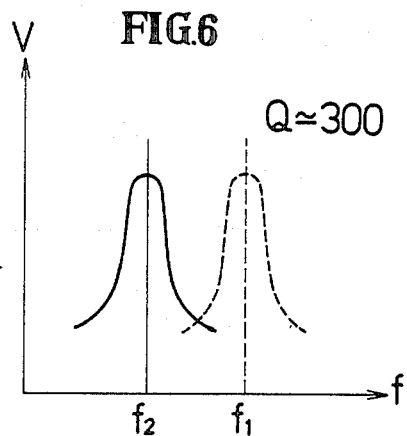

On the other hand, when the level of the frequency switching voltage given at the anode of the diode 20 via the resistor 22 from the switching voltage supplying terminal 26 is larger than the forward conductive voltage V1 of the switching diode 20, the switching diode 20 is switched from the nonconducting state to a conducting state and therefore, the oscillation circuit B is switched to oscillate around the oscillation frequency $f_2$ as shown in the dotted curved line of FIG. 6.

Figure 5:
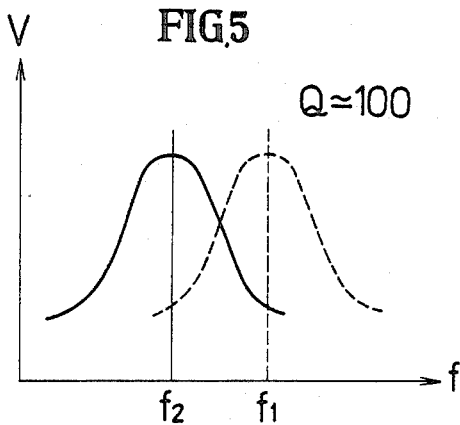
FIGS. 5 and 6 show graphs representative of frequency responses of the oscillation circuits in FIGS. 1 and 2, respectively.

In such an oscillation circuit B, either the nonconductive or the conductive state of the switching diode 20 is not affected by the oscillation circuit output since the peak voltage value Vp of the oscillation circuit output is less than the forward and reverse conductive voltages V1 and V2 of the switching diode 20. In addition, the electrostatic capacitance of the switching diode 20 is adequately small as compared to that of the capacitor 18, so that any leakage of the oscillation circuit output can be minimized. Consequently, as shown in FIGS. 5 and 6, the oscillation circuit B has an excellent frequency response as compared to that of the oscillation circuit A.

Figure 4:
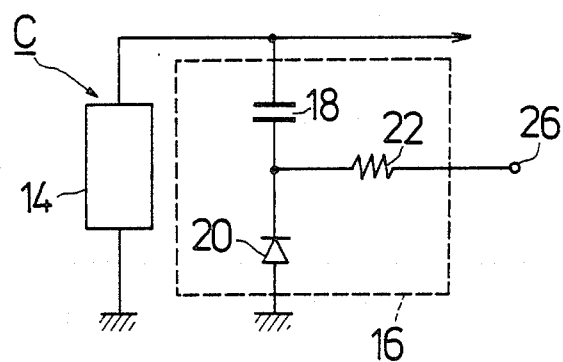
FIG. 4 shows a circuit diagram of an essential part of an oscillation circuit according to a second preferred embodiment of the present invention.

FIG. 4 shows a circuit diagram of an essential part of a second preferred embodiment of the present invention. In FIG. 4, like elements corresponding to those of FIG. 2 are indicated by the like numerals. In an oscillation circuit C in FIG. 4, a switching diode 20 is connected to the capacitor 18 in an opposite polarity from that of the diode 20 of FIG. 2. When the negative switching voltage is applied to the cathode of the switching diode 20 via the resistor 22 from the switching voltage supplying terminal 26, the switching diode 20 becomes conductive so that the oscillation circuit C in FIG. 4 oscillates around the oscillation frequency $f_2$.

In replace of the resistor 22 in FIGS. 2 and 4, an inductive element may be applicable for preventing a high frequency leakage in the embodiments of the present invention. Further, in the embodiments of the present invention, the oscillation frequencies of the oscillation circuits A, B and C may be switched at three or more stages.

The invention being thus described, it will be obvious that the same may be varied in many ways. Such variations are not to be regarded as a departure from the spirit and scope of the invention, and all such modifications are intended to be included within the scope of the following claims.

What is claimed is:

1. An oscillation circuit comprising:
   a dielectric resonator of a coaxial Transverse Electromagnetic (TEM) wave type having an oscillation frequency and developing an oscillation voltage signal at said oscillation frequency thereacross; and
   frequency switching means connected across said resonator for switching the oscillation frequency of said resonator, said frequency switching means including a capacitor and a diode connected in series, said diode having a small capacitance as compared to that of said capacitor and forward and reverse conductive voltage values with absolute values larger than an absolute value of a portion of said oscillation voltage signal that is developed across said diode.

2. The oscillation circuit as set forth in claim 1, further comprising a resistor for preventing a high frequency leakage.

3. The oscillation circuit as set forth in claim 1, further comprising an inductive element for preventing a high frequency leakage.

4. The oscillation circuit of claim 1 further comprising switching voltage input means for supplying a switching voltage to a junction between said capacitor and said diode such that a voltage applied across said diode has an absolute value larger than the absolute value of either of the forward and reverse conduction voltages of the diode, thereby causing the diode to be placed in a conductive state.

5. An oscillation circuit, comprising:
   resonator means for producing an oscillating signal wherein said resonator means is a dielectric resonator of a coaxial TEM wave type;
   a frequency switching means for switching oscillation frequencies of the resonator means, said switching means including a capacitor and a diode in series, said diode having a small capacitance as compared to said capacitor and forward and reverse conductive voltage values with absolute values larger than an absolute value of a peak voltage of that portion of the oscillation circuit output that is applied across the diode;
   amplifier means, operatively connected to said resonator for amplifying the oscillation signal produced by said resonator; and
   feedback means, operatively connected to said amplifier means, for stabilizing said amplifier means.

* * * * *

UNITED STATES PATENT AND TRADEMARK OFFICE
CERTIFICATE OF CORRECTION

PATENT NO.   : 4,694,262
DATED        : September 15, 1987
INVENTOR(S)  : Atsushi INOUE et al It is certified that error appears in the above-indentified patent and that said Letters Patent is hereby corrected as shown below:

Title page,
Please add:

item [73]  Assignee:   MURATA MANUFACTURING CO., LTD., Japan

Signed and Sealed this

Fourth Day of June, 1996

Attest:

BRUCE LEHMAN

*Attesting Officer*          *Commissioner of Patents and Trademarks*